(12) United States Patent
Swanson et al.

(10) Patent No.: US 7,444,559 B2
(45) Date of Patent: *Oct. 28, 2008

(54) GENERATION OF MEMORY TEST PATTERNS FOR DLL CALIBRATION

(75) Inventors: Travis E. Swanson, Ramsey, MN (US); Roy E. Greeff, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 507 days.

This patent is subject to a terminal disclaimer.

(21) Appl. No.: 10/766,386

(22) Filed: Jan. 28, 2004

(65) Prior Publication Data

US 2005/0166110 A1  Jul. 28, 2005

(51) Int. Cl.
G11C 29/00 (2006.01)
G01R 31/28 (2006.01)
(52) U.S. Cl. .................. 714/718; 714/735; 714/738
(58) Field of Classification Search ................ 714/738, 714/712, 700, 707, 731, 735–736, 744, 775, 714/798, 718–719, 819; 365/200, 201, 233, 365/193, 194; 327/156
See application file for complete search history.

(56) References Cited

U.S. PATENT DOCUMENTS

| 4,783,732 | A | * | 11/1988 | Morton | 365/230.05 |
| 4,800,530 | A | * | 1/1989 | Itoh et al. | 365/189.12 |
| 5,383,143 | A | * | 1/1995 | Crouch et al. | 708/254 |
| 5,412,665 | A | * | 5/1995 | Gruodis et al. | 714/739 |
| 5,530,895 | A | * | 6/1996 | Enstrom | 710/9 |
| 6,310,856 | B1 | * | 10/2001 | Taipale | 370/208 |
| 6,385,129 | B1 | * | 5/2002 | Silvestri | 365/233 |
| 6,401,213 | B1 | | 6/2002 | Jeddeloh | |
| 6,424,691 | B1 | * | 7/2002 | Neravetla et al. | 377/48 |
| 6,567,017 | B2 | * | 5/2003 | Medlock et al. | 341/50 |
| 6,970,529 | B2 | * | 11/2005 | Cranford et al. | 375/376 |
| 2002/0194557 | A1 | * | 12/2002 | Park | 714/718 |
| 2005/0071399 | A1 | * | 3/2005 | Bonaccio et al. | 708/250 |
| 2005/0162948 | A1 | * | 7/2005 | Swanson et al. | 365/201 |
| 2006/0029177 | A1 | * | 2/2006 | Cranford et al. | 375/376 |

OTHER PUBLICATIONS

Cheryl E. Praeger, Linear Feedback Shift Registers, Chapter 4, pp. 1-10, available at http://www.maths.uwa.edu.au/~praeger/teaching/3CC/WWW/chapter4.html on Aug. 18, 2003.

* cited by examiner

*Primary Examiner*—Phung M Chung
(74) *Attorney, Agent, or Firm*—Jones Day; Edward L. Pencoske

(57) ABSTRACT

A system and method to generate memory test patterns for the calibration of a delay locked loop (DLL) using pseudo random bit sequences (PRBS) generated through a pair of liner feedback shift registers (LFSR). The generated patterns are implemented on the system data bus as test patterns that closely simulate run-time switching conditions on the system bus, so as to allow more accurate calibration of the DLL. Test data write/read operations may be performed while signals for the test patterns are present on various bit lines in the data bus so as to allow for accurate determination or adjustment of the value for the delay to be provided by the DLL to the strobe signals during memory data reading operations at run time. Memory chips may also be tested over an operating range of values using the generated test patterns.

22 Claims, 3 Drawing Sheets

GENERATION OF MEMORY TEST PATTERNS FOR DLL CALIBRATION

REFERENCE TO RELATED APPLICATION

The disclosure in the present application is related to the disclosure provided in the commonly-assigned United States patent application titled "Providing Memory Test Patterns for DLL Calibration," filed concurrently herewith, now U.S. Pat. No. 2005/0162984 published Jul. 28, 2005.

BACKGROUND

1. Field of the Disclosure

The present disclosure generally relates to an electronic memory and, more particularly, to the generation of a test pattern of pseudo random bit sequence (PRBS) during calibration of a delay locked loop (DLL) and during memory testing.

2. Brief Description of Related Art

Memory devices are widely used in many electronic products and computers to store data. A memory device includes a number of memory cells, each cell storing one bit of data. The data stored in the memory cells can be read during a read operation.

One type of memory device includes a reference signal to accompany data signals during a read operation. The reference signal, commonly known as a "strobe," is used to track the output timing of the data signals read from the memory cells. In some traditional memory devices, the strobe signal is generated or turned on only during a read operation so as to enable downstream latching circuits (or flip-flops) to properly latch the data read from the memory cells. When a strobe is received in phase with the data it is latching, the strobe is preferably centered in the middle of the data so as to allow the latching circuits to more accurately time the latching operation. The centering of the strobe signal is generally done through a delay locked loop (DLL), which delays the strobe so that the latching edge of the strobe hits a flip-flop when the middle of the data window hits that flip-flop. The DLL, in turn, has to be calibrated to provide appropriate delay to the strobe signal during a data read operation. Current DLL calibration methods store very limited and generic test patterns in the memory's on-chip BIOS (basic input/output system). One such 16-bit generic test pattern is A5A5h for switching a bus to which the memory is connected during a data write/read operation. Current calibration methods switch only the whole bus with such a generic test pattern. That is, current calibration methods switch every bit line on the bus common-mode, i.e., with the same test pattern. A problem with this approach is that a high speed memory bus is rarely at a 100% usage, and the current methods of calibrating a DLL from the memory BIOS may not result in a very good representation of the bus under worst case switching conditions. Also, in the current methods, the BIOS may have limited control over the bus and over the individual bits or bytes on the bus.

As the current methods do not allow for the DLL calibration of each memory device under the worst case SSO (Simultaneous Switching Outputs) and cross-talk conditions on the bus, it is desirable to devise a method that generates memory test patterns to calibrate the DLL for each bit of each memory device for SSO, cross-talk, data routing mismatch and data loading mismatch.

SUMMARY

In one embodiment, the present disclosure contemplates a method of generating a signaling pattern for a bus having a plurality of bit lines. The method comprises, for each selected bit line in the plurality of bit lines, generating, using, for example, a first linear feedback shift register, a first plurality of signals to be sent over the selected bit line; and further generating, using, for example, a second linear feedback shift register, a second plurality of signals to be sent over at least one bit line in the plurality of bit lines other than the selected bit line.

In another embodiment, the present disclosure contemplates a method of signaling a bus having a plurality of bit lines. The method comprises transmitting a first plurality of signals on a selected one of the plurality of bit lines; simultaneously transmitting a second plurality of signals on one or more of the plurality of bit lines other than the selected bit line; and repeating the transmitting and simultaneously transmitting for each bit line in the plurality of bit lines.

In a further embodiment, the present disclosure contemplates a method of operating a memory connected to a bus. The method comprises transmitting a first plurality of signals on a selected one of a plurality of bit lines in the bus; simultaneously transmitting a second plurality of signals on one or more of the plurality of bit lines other than the selected bit line; and performing a data write/read operation at a data storage location in the memory using the bus while the signals in the transmitting and simultaneously transmitting steps are present on respective bit lines in the bus.

In a still further embodiment, the present disclosure contemplates a system comprising a memory chip, a bus having a plurality of bit lines, and a processor connected to the memory chip via the bus and in communication therewith through the bus. The processor is configured to perform the following: transmit a first plurality of data patterns on a selected one of the plurality of bit lines in the bus, and transmit a second plurality of data patterns on one or more of the plurality of bit lines other than the selected bit line.

According to the methodology of the present disclosure, memory test patterns for the calibration of a delay locked loop (DLL) are generated using pseudo random bit sequences (PRBS) obtained as outputs from linear feedback shift registers (LFSR). The test patterns are implemented on the system data bus as aggressor and victim test patterns. The aggressor and victim patterns closely simulate run-time switching conditions on the system bus, so as to allow more accurate calibration of the DLL. Test data write/read operations may be performed while the aggressor and victim signals are present on various bit lines in the data bus so as to allow for accurate determination or adjustment of the value for the delay to be provided by the DLL to the strobe signals during memory data reading operations at run time. The present method introduces differential artifacts in the switching of the data bus, thereby allowing consideration of simultaneous switching outputs (SSO), cross talk, routing and loading mismatch conditions, etc., on the data bus during DLL calibration. In the present method, the data bus is represented under the worst case switching conditions, thereby allowing optimum delay calibration for the DLL. Memory chips may also be tested over an operating range of values using the generated test patterns.

BRIEF DESCRIPTION OF THE DRAWINGS

For the present disclosure to be easily understood and readily practiced, the present disclosure will now be described for purposes of illustration and not limitation, in connection with the following figures, wherein.

DETAILED DESCRIPTION

Reference will now be made in detail to some embodiments of the present disclosure, examples of which are illustrated in the accompanying drawings. It is to be understood that the figures and descriptions of the present disclosure included herein illustrate and describe elements that are of particular relevance to the present disclosure, while eliminating, for the sake of clarity, other elements found in typical solid-state memories or memory-based systems. It is noted at the outset that the terms "connected", "connecting," "electrically connected," etc., are used interchangeably herein to generally refer to the condition of being electrically connected.

Figure 1:
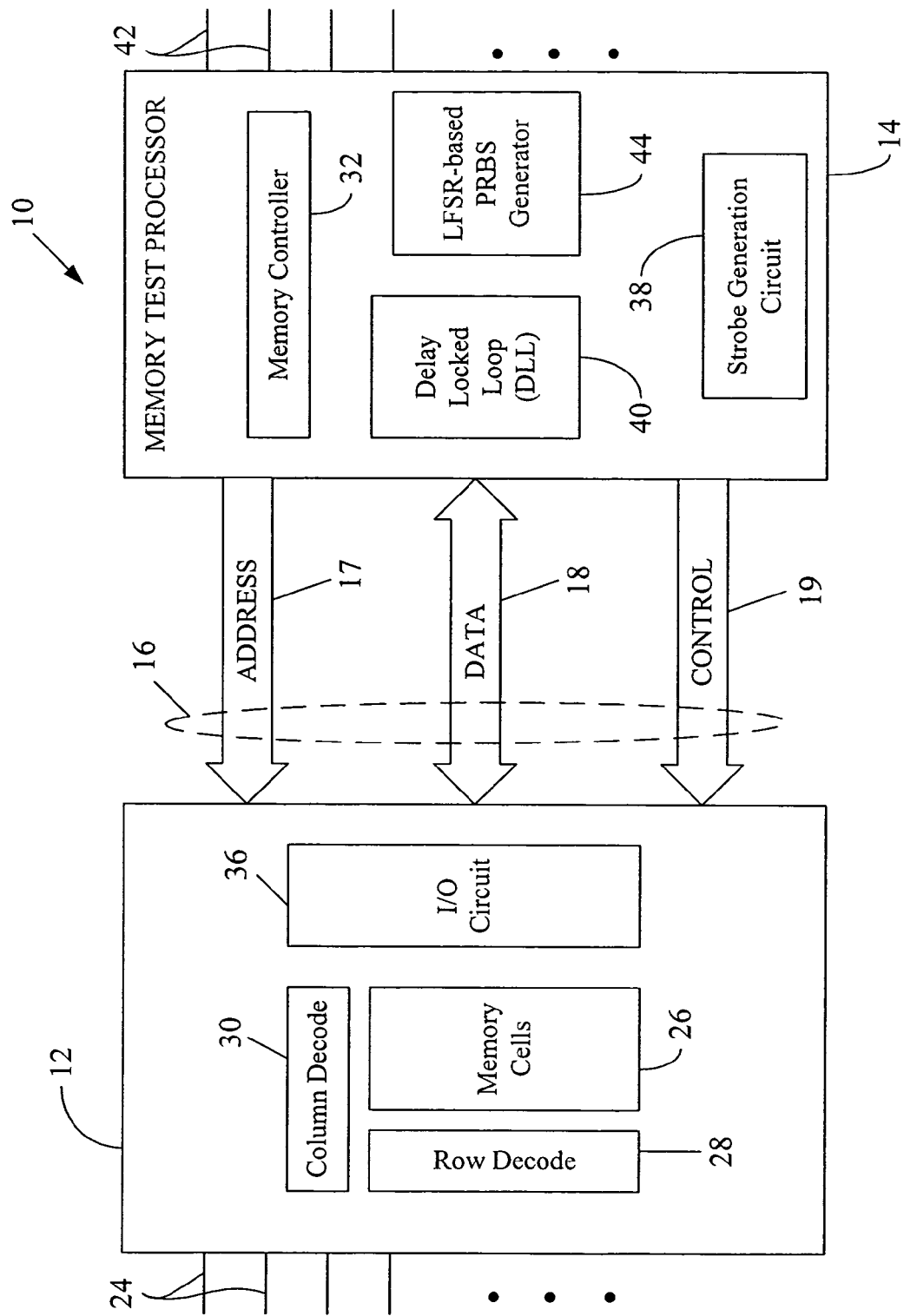
FIG. 1 is block diagram showing an exemplary system for DLL calibration including a memory chip in communication with a memory test processor via a bus.

FIG. 1 is block diagram showing an exemplary system 10 for DLL calibration including a memory chip or memory device 12 in communication with a memory test processor 14 via a system bus 16. The processor 14 can be a microprocessor, digital signal processor, embedded processor, micro-controller, dedicated memory test chip, or the like. In one embodiment, the processor 14 is a memory test chip that includes a memory controller as discussed below. The chip 12 has a plurality of pins 24 located outside of chip 12 for electrically connecting the chip 12 to other system devices. For example, some of those pins 24 may connect the chip 12 to the system bus 16, thereby allowing the processor 14 to communicate with the chip 12 and perform memory read/write operations. In one embodiment, the memory chip 12 is a dual in-line memory module (DIMM). The processor 14 and the memory chip 12 communicate using address signals on the address lines or address bus 17, data signals on the data lines or data bus 18, and control signals (e.g., a row address select (RAS) signal, a column address select (CAS) signal, etc. (not shown)) on the control lines or control bus 19. In FIG. 1, the address, data and control buses 17-19 are shown to collectively form the system bus 16. Each line in the system bus 16 is referred to hereinbelow as a "bit line." Thus, for example, eight bit lines in the data bus 18 are needed to transfer a byte of data from the memory chip 12 to the processor 14, and vice versa.

Although the discussion of data read/write operations given hereinbelow is primarily described with reference to the data bus 18, it is noted here that the memory test pattern generation methodology discussed herein may be implemented on any portion of the system bus 16 (or any other signal-carrying lines connected to the memory chip 12). In other words, the methodology of the present disclosure is not confined to only data-carrying bus applications, i.e., the data bus 18 portion of the system bus 16.

The memory chip 12 can be a dynamic random access memory (DRAM) chip or another type of memory circuits such as SRAM (Static Random Access Memory) chip or Flash memory. Furthermore, the DRAM could be a synchronous DRAM commonly referred to as SGRAM (Synchronous Graphics Random Access Memory), SDRAM (Synchronous Dynamic Random Access Memory), SDRAM II, or DDR SDRAM (Double Data Rate SDRAM), as well as Synchlink or Rambus DRAMs. Those of ordinary skill in the art will readily recognize that memory chip 12 of FIG. 1 is simplified to illustrate one embodiment of a memory chip and is not intended to be a detailed illustration of all of the features of a typical memory chip. Numerous peripheral devices or circuits may be typically provided as part of the system 10 for writing data to and reading data from the memory cells 26. However, these peripheral devices or circuits are not shown in FIG. 1 for the sake of clarity.

The memory chip 12 may include a plurality of memory cells 26 generally arranged in rows and columns to store data in rows and columns. A row decode circuit 28 and a column decode circuit 30 may select the rows and columns in the memory cells 26 in response to decoding an address, provided on the address bus 17. Data to/from the memory cells 26 is then transferred over the data bus 18 via sense amplifiers and a data output path (not shown). A memory controller 32 may provide relevant control signals (not shown) on the control bus 19 to control data communication to and from the memory chip 12 via an I/O (input/output) circuit 36. The I/O circuit 36 may include a number of data output buffers to receive the data bits from the memory cells 26 and provide those data bits or data signals to the corresponding bit lines in the system bus 16.

The memory controller 32 may control data communication to/from the memory device 12 and may include a decode circuit (not shown) to determine the modes of operation of memory chip 12. Some examples of the input signals or control signals (not shown in FIG. 1) on the control bus 19 include an External Clock signal, a Chip Select signal, a Row Access Strobe signal, a Column Access Strobe signal, a Write Enable signal, etc. The memory chip 12 communicates to other devices in the system 10 via the pins 24 on the chip 12. These pins, as mentioned before, may be connected to appropriate address, data and control lines in the system bus 16 to carry out data transfer (i.e., data transmission and reception) operations.

The memory test processor 14 may also be an integrated circuit (IC) chip with a number of external pins—collectively designated by reference numeral "42" in FIG. 1—that allow the chip to be electrically connected to other devices. For example, in FIG. 1, the test processor 14 is shown connected to the memory chip 12 via the system bus 16. In the embodiment shown in FIG. 1, the processor 14 includes a liner feedback shift register (LFSR)-based pseudo random bit sequence (PRBS) generator 44, and the memory controller 32. The PRBS generator 44 may include an LFSR circuit 46 shown in FIG. 2 and may also include a decode circuit 48 shown in FIG. 4, both of the circuits 46 and 48 are described in more detail later hereinbelow. The processor 14 may be pre-programmed, in hardware or software, or programmed at run time to activate the PRBS generator circuit 44 as desired to perform generation and transmission of memory test patterns as per the exemplary steps depicted in FIG. 3 and discussed in more detail hereinbelow. In one embodiment, the processor 14 is programmed in Verilog®.

The memory test processor 14 may also include a delay locked loop (DLL) circuit 40 and a strobe generation circuit 38. The DLL circuit 40 may provide a clock signal to accompany a data signal, which is read from memory cells 26 during a data read operation. The strobe generation circuit 38 may provide a strobe signal that may be sent to the DLL 40 that, in turn, may introduce a delay into the strobe signal so as to synchronize the strobe signal with the data signal during the data read operation from memory cells 26. The strobe signal is a reference signal or timing signal, which tracks the data signal when the data is output. Other circuits or devices, based on the timing of the strobe signal, can accurately capture or "latch" the data signal. The DLL 40 operates in a manner such that the data and strobe signals are synchronized with the external clock signal (not shown) when the data and strobe signals are output to other system devices. In one embodiment, the strobe generation circuit 38 may be part of the DLL circuit 40. The DLL circuit 40 may also include other conventional circuit elements (not shown in FIG. 1), such as a multi-tap delay line, a phase detector, a controller, and a model circuit. Therefore, the construction and operation of these circuit elements of DLL 40 will not be described in detail in this disclosure. It is sufficient here to state that the delay line (not shown) in the DLL 40 may include a plurality of delay cells connected in a series, in which each of the delay cells can delay a signal (e.g., the strobe signal) for a predetermined amount of time. Depending on the number of delay cells selected, the amount of delay applied to the strobe signal varies accordingly.

It is noted here that the DLL circuit 40 is shown to be a part of the memory test processor or memory controller chip 14, which performs the DLL calibration discussed below. However, in an alternative embodiment, the memory device 12 may contain the DLL 40, which can be used to center an incoming strobe (e.g., a strobe from the strobe generation circuit 38) or an outgoing strobe (e.g., when the strobe generation circuit 38 is also a part of the memory device 12 or during data write operations). In a still further embodiment, the memory device 12 may be configured to include the memory controller 32. However, in the embodiment of FIG. 1, all such circuit elements are included in the memory test processor 14 so as to keep the design of the memory device 12 as simple as possible.

Figure 2:
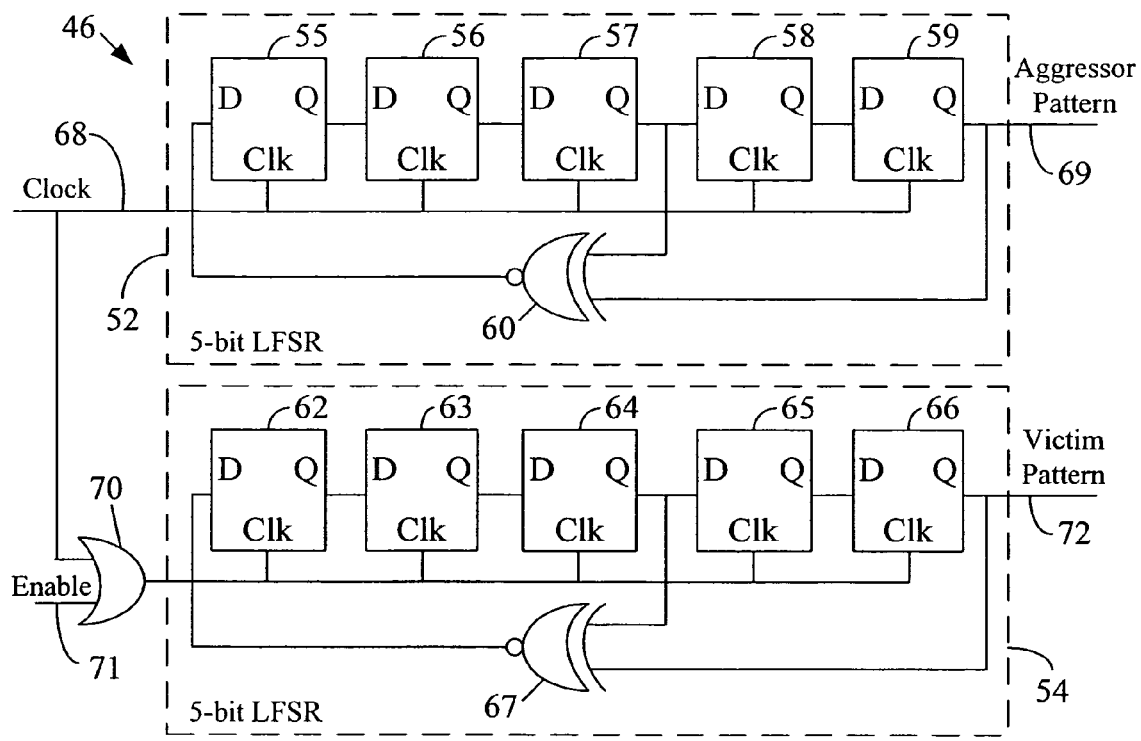
FIG. 2 illustrates how, in one embodiment of the present disclosure, a set of memory test patterns are generated during DLL calibration using an exemplary linear feedback shift register circuit.

FIG. 2 illustrates how, in one embodiment of the present disclosure, a set of memory test patterns are generated during DLL calibration using an exemplary LFSR circuit 46. The LFSR circuit 46 is shown to include two linear feedback shift registers 52, 54 arranged in a Victim/Aggressor format. The first LFSR 52 is configured to provide the "aggressor" test pattern (discussed later hereinbelow) and the second LFSR 54 is configured to provide the "victim" test pattern (also discussed later hereinbelow). Each of the aggressor and victim test patterns is a pseudo-random bit sequence (PRBS) generate by the respective LFSR 52, 54. The length of each aggressor and victim PRBS depends on the number of flip-flops in the corresponding LFSR 52, 54. The number of flip-flops in the LFSR 52, 54 (i.e., the bit size of the LFSR) may be selected depending on the desired pattern size (31 bits ($2^5-1$), 63 bits ($2^6-1$), etc.) and the time allowed For DLL calibration. In the embodiment shown in FIG. 2, each LFSR 52, 54 includes five (5) D-type flip-flops 55-59 and 62-66, respectively. The use of five (5) D-type flip-flops in each LFSR 52, 54 in FIG. 2 results in generation of an aggressor and victim test patterns each having a "period" or length of $2^5-1=31$ bits. Hence, the initial non-zero key pattern (e.g., 10110 or any other 5-bit pattern) input to each LFSR 52, 54 will be repeated after 31 bits are output from the LFSR or starting from the $32^{nd}$ bit output from the LFSR. In one embodiment, the initial pattern may be all 1's (11111) when each LFSR 52, 54 is reset prior to commencing the test pattern generation as indicated, for example, at block 73 in FIG. 3. Each LFSR 52, 54 may also include an exclusive-NOR (XNOR) gate 60, 67 in appropriate feedback configuration to generate a PRBS bit stream at the corresponding outputs 69 and 72, respectively. The respective outputs 69, 72, thus provide the corresponding aggressor and victim test patterns as shown in FIG. 2. The outputs are obtained by clocking the LFSRs 52, 54 with a clock signal 68 at their respective inputs. A two-input OR gate 70 is provided to logically OR the clock signal 68 with an enable input 71 (discussed later hereinbelow). The output of the OR gate 70 is then supplied as a clock signal to the LFSR 54.

It is noted that the terms "aggressor" and "victim" are used herein merely to distinguish between two PRBS patterns transmitted, preferably simultaneously, on the data bus 18. The aggressor and victim patterns are signaling patterns that are transmitted on different bit lines in the data bus 18 to simulate extreme switching conditions on the bus so that the calibration or settings for the DLL 40 performed under these extreme switching conditions (or "test conditions") will allow for a more accurate DLL setting because of the feasibility to account for SSO, cross-talk, routing mismatch, and other worst-case switching conditions that may be present on a bus during run time. The DLL 40 calibrated under these extreme test conditions may provide an optimum delay to strobe signals during run time, thereby allowing the strobe to remain centered in the middle of the data signal (from the memory cells 26) even under extreme switching conditions during run time.

Figure 3:
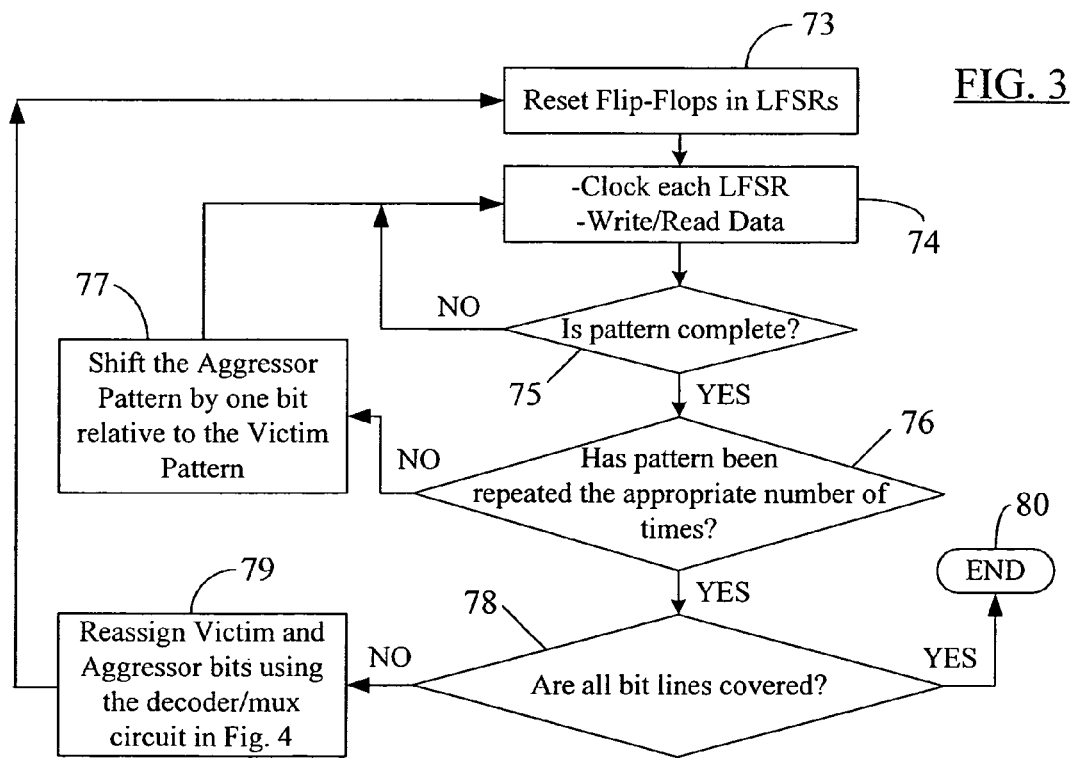
FIG. 3 is an exemplary flowchart depicting the memory test pattern generation process according to one embodiment of the present disclosure.

FIG. 3 is an exemplary flowchart depicting the memory test pattern generation process according to one embodiment of the present disclosure. Various process steps illustrated in FIG. 3 may be performed by the test processor 14 when appropriately configured or programmed to do so. Initially, at block 73, all flip-flops 55-59 and 62-66 are reset prior to commencing pseudo-random bit sequence generation. In one embodiment, as noted before, the flip-flops 55-59, 62-66 may generate a predetermined initial key pattern (e.g., 11111) upon reset. In an alternative embodiment, any other initial key pattern (e.g., 11011) may be input to the flip-flops during resetting thereof. After resetting the flip-flops, the clock signal 68 may be applied (block 74) to each flip-flop 55-59, 62-66 to start generating the PRBS aggressor and victim patterns at the outputs of the LFSRs 52, 54. Each clock cycle typically generates one bit of the aggressor pattern and one bit of the victim pattern, both of which are applied to corresponding bit lines in the data bus 18 (discussed later hereinbelow). The clock 68 is applied to each flip-flop in each LFSR 52, 54 until the entire length (here, 31 bits) of the pattern is generated as indicated by the decision block 75. It is observed here that during the first iteration of the pattern generation (i.e., the steps indicated at blocks 73-75 in FIG. 3), the Enable input 71 to the OR gate 70 may be held low (or inactive) so as to allow the clock 68 to be simultaneously applied to both of the LFSRs 52, 54. As discussed later hereinbelow, after each generation of complete aggressor and victim test patterns, the Enable input 71 may be used to shift the aggressor and/or victim test patterns by a desired number of bits.

It is noted here that, as part of the DLL calibration process, while each pair of victim and aggressor bits is present on the corresponding bit lines in the data bus 18, the processor 14 (FIG. 1) may perform a test data write/read operation (block 74 in FIG. 3) on the memory cells 26 with the help of the memory controller 32. In an alternative embodiment, the processor 14 may be configured to perform the test data write/read operation after the entire aggressor and victim patterns are output on corresponding bit lines in the data bus 18. Based on the accuracy or integrity of the data read during various data write/read operations throughout the test pattern generation process at blocks 73-79, the processor 14 (preferably, the memory controller 32) may adjust (preferably, after the conclusion of the test pattern generation at block 80) the value of the delay programmed in the DLL 40 to be applied to the strobe signals from the strobe generation circuit 38. The programming of the DLL may be referred to as "DLL calibration." As is known in the art, the process of DLL calibration typically involves reading memory data relative to the memory controller 32; the data is written and then read back with a middle DLL setting for the data receiving strobe. The data read is then checked for errors against the data written. This process may be repeated with various DLL settings until an error is found at the longest/highest delay setting and at the lowest/shortest delay setting. The DLL may be then set or "calibrated" in the middle of these two settings. This process could also be applied to data writes using a DLL on the transmit/write strobe. A detailed description of how a DLL may be calibrated can be found in the U.S. Pat. No. 6,401,213 to Jeddeloh, the disclosure of which is incorporated herein by reference in its entirety.

The aggressor and victim patterns may be implemented on many bits of the data bus 18 (i.e., on a portion of the data bus) or on all the bit lines in the data bus 18 (i.e., on the entire data bus). In any event, the victim pattern is implemented on a very limited or far fewer number of bits (e.g., as few as one) than the number of bits carrying the aggressor pattern. For example, the victim pattern may be implemented on one bit line in the data bus 18, whereas one or more of the rest of the bit lines in the data bus 18 may implement an identical aggressor pattern on all of them. Alternatively, if it is decided to generate the test pattern for eight (8) bit lines (byte) within the data bus 18 (which can be, for example, 32-bits wide), then, in one embodiment, the victim pattern may be implemented on one of the 8 bit lines and the other seven (7) bit lines may carry the aggressor pattern. In another embodiment, the victim pattern may be implemented on two of the 8 bit lines and the other six (6) bit lines may carry the aggressor pattern.

Figure 4:
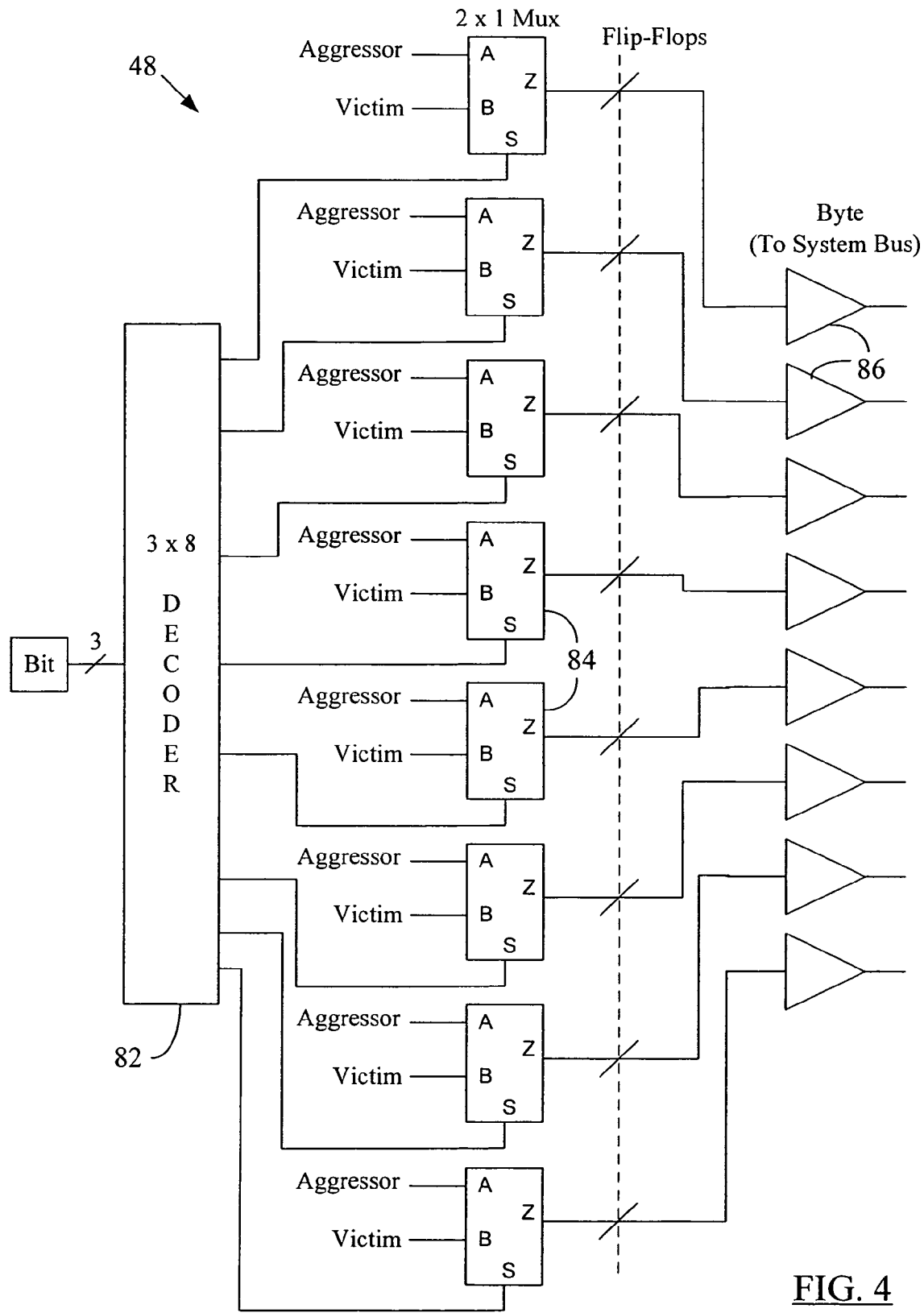
FIG. 4 shows an exemplary decode circuit that may be used to place aggressor or victim test patterns on corresponding bit lines in a byte of a system bus.

FIG. 4 shows an exemplary decode circuit 48 that may be used to place aggressor or victim test patterns on corresponding bit lines in a byte of a system bus (here, the data bus 18 portion of the system bus 16). The decode circuit 48 may be a part of the PRBS generator circuit 44, or, alternatively, may be a separate circuit inside the processor chip 14 electrically connected (not shown) to the PRBS generator 44. The circuit 48 in FIG. 4 implements one victim pattern within a byte in the data bus 18, and the rest of the bit lines in the data bus 18 are supplied with the aggressor pattern. At the initiation of the DLL calibration process, the processor 14 may be configured to internally generate or provide a beginning sequence of three bits to be decoded by a 3×8 decoder 82 to select one bit line in the data bus 18 as having a victim pattern thereon, whereas all other bit lines in the data bus 18 as having an identical aggressor pattern thereon. The operation of the circuit in FIG. 4 is straightforward. For each 3-bit sequence input, the decoder 82 allows only one of the selector (S) inputs to go high, thereby selecting one of the 2×1 multiplexer (MUX) 84 to output the victim pattern, which may be stored in an intervening flip-flop (not shown in FIG. 4) prior to being applied to a corresponding bus line via an output buffer 86. The output buffers 86 may be connected to appropriate pins 42 on the chip 14 so as to apply the signal from the buffer to appropriate bus lines connected to the pins 42.

When one selector input of one of the eight multiplexers 84 goes high, all the remaining selector inputs will go low, thereby allowing the rest of the multiplexers 84 to transmit the aggressor pattern on the data bus lines connected to their respective output buffers 86. Thus, for each 3-bit combination at its input, the decoder 82 selects only one of eight bit lines (in the data bus 18) to keep receiving different bits in the victim pattern (which is generated by the LFSR 54 at its output 72 and supplied through the "Victim" input at the respective multiplexer 84) generated during the iteration of the processing loop defined by blocks 74-75 in FIG. 3. While the victim pattern is being output on a selected bit line, the other seven bit lines in the data bus 18 simultaneously keep receiving different bits in the corresponding aggressor pattern (generated by the LFSR 52 at its output 69 and supplied through the "Aggressor" inputs at respective multiplexers 84) also generated during the iteration of the processing loop defined by blocks 74-75 in FIG. 3.

Although the circuit in FIG. 4 shows only eight bit lines to be applied with test patterns, the circuit configuration in FIG. 4 may be repeated to simultaneously apply the test patterns to all the bit lines in the data bus 18. In that event, more than one bit line in the data bus 18 may contain the victim pattern. Alternatively, the same circuit shown in FIG. 4 may be used repeatedly to select, one after another, different bytes in the data bus 18 so as to eventually cover the entire data bus 18 for testing. In this situation, there may be only one bus line carrying the victim test pattern at a time. It is observed here that the same PRBS test pattern may be implemented as a victim pattern at one time and as an aggressor pattern at another time. Furthermore, the first aggressor and victim test patterns generated (at blocks 74-75) after the reset of the flip-flops at block 73 may be identical. Thereafter, these initial test patterns may be shifted or offset by one or more bits as discussed later with reference to description of block 77 in FIG. 3.

After the first aggressor and victim test patterns are output (blocks 74-75), the processor 14 determines whether the patterns have been repeated an appropriate number of times (block 76). The number of repetition may be predetermined or, alternatively, may be programmed into the processor 14 at run time. In the embodiment of FIG. 2 with five flip-flops per LFSR, it was noted earlier that the maximum length of a test pattern can be 31 bits ($2^5-1$). Therefore, there may be a maximum of 31 different combinations or repetitions of the aggressor and victim test patterns before returning to the initial combination at the start of the process; in each repetition, the aggressor test pattern is shifted by one bit from the victim test pattern (block 77). Thus, the first combination of these test patterns (prior to any activation of the Enable input 71) includes an identical aggressor and victim test patterns generated at blocks 74-75 in FIG. 3. Thereafter, at block 77, the Enable input 71 of the OR gate 70 may be held active (i.e., "high" in an active high configuration) for one clock period of the clock 68 so as to disable the clock being applied to the victim LFSR 54, thereby shifting the aggressor test pattern by one bit relative to the victim test pattern. After one clock period has elapsed, the Enable input 71 is held inactive (i.e., in a "low" state) so as to allow the clock 68 to be applied again to the flip-flops 62-66 in the victim LFSR 54, thereby continuing the generation of the 31-bit victim test pattern (which is already offset by one bit from the corresponding aggressor pattern at output 69). After the bit shift, the entire victim and aggressor test patterns are generated and data write/read operations performed (blocks 74-75) as discussed before. Then, again it is checked at block 76 whether all 31 combination patterns are generated. If not, then the Enable input 71 is again activated for one clock period (block 77)—this time shifting the aggressor and victim test patterns by an additional bit or two bits in total. The process at blocks 74-77 is repeated until all the aggressor and victim pattern combinations are generated (i.e., until the aggressor and victim test patterns are offset by 31 bits) and sent over the corresponding bit lines in the data bus 18. It is observed here that, in an alternative embodiment, the Enable signal and the OR gate 70 may be employed with respect to the aggressor LFSR 52 instead of the victim LFSR 54 as is the case in the embodiment of FIG. 2. In that case, the clock signal 68 may be applied directly to the victim LFSR 54 and through the OR gate 70 to the aggressor LFSR 52.

Thus, upon each completion of the transmission of all 31 bits in the victim pattern, the aggressor pattern is offset from the victim pattern by an additional bit (block 77 in FIG. 3). The entire process at blocks 73-77 is then repeated, as indicated by blocks 78 and 79, for each bit within a byte in the data bus 18 prior to terminating at block 80. For example, at decision block 78 it is determined whether all bit lines in the eight bit lines in the data bus 18 have the victim test pattern applied thereon at least once. If any bit line is left without a victim test pattern sent over it, then the processor 14 may send another 3-bit sequence to the 3×8 decoder 82, which, in turn, may select the appropriate MUX 84 to output the victim test pattern to the corresponding bit line in the data bus 18. In this manner, with different 3-bit inputs to the decoder 82, all eight bit lines in the data bus 18 may be successively applied with victim patterns. As discussed before, a circuit may be devised to apply the victim pattern to more than one bit line simultaneously. Similarly, more than eight bit lines may be considered for test pattern signaling. The process at blocks 73-80 in FIG. 3 may then be repeated for each byte in the data bus 18 until all of the bit lines in the data bus 18 are exercised or signaled with the appropriate victim and aggressor test patterns.

Thus, the signaling scheme implemented through the flowchart in FIG. 3 does not switch the data bus 18 common-mode, but, instead, introduces differential artifacts (i.e., aggressor and victim signals with varying offsets therebetween) on the signals/noise present on the bit lines in the data bus 18. In this manner, the DLL 40 of a source synchronous bus (e.g., the system bus 16) may be calibrated for each memory device under the worst case switching conditions that may be present on the system bus 16 or on a portion of it (e.g., the data bus 18). In one embodiment, when there is no PRBS test pattern generated using the LFSR generator 44, then a set of test patterns can be stored in a serial presence detect circuit (not shown) in a memory DIMM and selectively applied to appropriate bit lines in the data bus 18.

In an alternative embodiment, in addition to the calibration of a DLL, the test patterns generated according to the teachings of the present disclosure (as described with reference to FIGS. 2-4) may be used to test a memory chip (e.g., the memory chip 12 in FIG. 1). After the DLL (e.g., the DLL 40 in FIG. 1) is calibrated using the test patterns described hereinbefore, the testing of the memory chip 12 may be carried out. In testing of a memory chip, the operating conditions of the memory chip may be changed in relation to the test patterns present on the system bus 16, instead of adjusting or changing the strobe delays as in case of DLL calibration. Some examples of memory operating conditions include supply voltage(s), reference voltage(s), temperature, etc. In one embodiment, after completion of each test pattern generation, one or more memory operating conditions (e.g., a voltage and/or temperature) are changed. These changes in operating conditions are carried out over a range of values that constitutes a memory device's operating range. If the data is found corrupted during read/write operations (performed while the test patterns are present on the system bus 16 as discussed before) within this range of operating conditions, then that memory chip fails testing. On the other hand, if no failure (i.e., no data corruption) is observed during the read/write operations over these changing operating conditions, the memory chip is considered to have "passed" the testing. The memory chip testing described herein may be performed automatically with suitable hardware and software.

The foregoing describes how to generate memory test patterns for the calibration of a delay locked loop (DLL) using pseudo random bit sequences (PRBS) generated through a pair of linear feedback shift registers (LFSR). The generated patterns are implemented on the system data bus as aggressor and victim test patterns. The aggressor and victim patterns closely simulate run-time switching conditions on the system bus, so as to allow more accurate calibration of the DLL. Test data write/read operations may be performed while the aggressor and victim signals are present on various bit lines in the data bus so as to allow for accurate determination or adjustment of the value for the delay to be provided by the DLL to the strobe signals during memory data reading operations at run time. Memory chips may also be tested over an operating range of values using the generated test patterns.

While the disclosure has been described in detail and with reference to specific embodiments thereof, it will be apparent to one skilled in the art that various changes and modifications can be made therein without departing from the spirit and scope of the embodiments. Thus, it is intended that the present disclosure cover the modifications and variations of this disclosure provided they come within the scope of the appended claims and their equivalents.

What is claimed is:

1. A method of operating a processor connected to a memory through a bus having a plurality of bit lines, said method comprising:
    selecting a first group of bit lines from said bus to carry a first plurality of data patterns;
    selecting at least one of the remaining bit lines from said bus not within said first group to carry a second data pattern;
    transmitting one or more of said first plurality of data patterns on said first group of bit lines in said bus;
    transmitting said second data pattern on said at least one of the remaining bit lines;
    performing data write/read operations at a data storage location in said memory using said bus and said one or more of said first plurality of data patterns and said second data pattern; and
    adjusting a delay based on an accuracy of data read compared to data written in said data write/read operations.

2. The method of claim 1, wherein said performing includes:
    performing reading of data as part of said data write/read operations in conjunction with a strobe signal received from a delay locked loop.

3. The method of claim 2, further comprising:
    configuring said delay locked loop to provide said delay to said strobe signal such that said strobe signal is centered in the middle of data signals.

4. The method of claim 1, wherein said first plurality of data patterns contains said second data pattern.

5. The method of claim 1, further comprising:
    transmitting a different data pattern of said first plurality of data patterns; and
    repeating said transmitting of said second data pattern and said performing data write/read operations.

6. The method of claim 5, further comprising shifting a data pattern of said first plurality of data patterns by at least one bit to generate said different data pattern of said first plurality of data patterns.

7. The method of claim 1, wherein each data pattern of said first plurality of data patterns is concurrently transmitted with said second data pattern.

8. A system comprising:
a memory chip including a plurality of storage locations to store data;
a bus having a plurality of bit lines; and
a processor connected to said memory chip via said bus and in communication therewith through said bus, wherein said processor is configured to perform the following:
select a first group of bit lines from said bus to carry a first plurality of data patterns;
select at least one of the remaining bit lines from said bus not within said first group to carry a second plurality of data patterns;
transmit one or more of said first plurality of data patterns on said first group of bit lines,
transmit one or more of said second plurality of data patterns on said at least one of the remaining bit lines;
perform data write/read operations at one of said plurality of storage locations using said bus and said one or more of said first plurality of data patterns and said one or more of said second plurality of data patterns; and
adjust a delay based on an accuracy of data read compared to data written in said data write/read operations.

9. The system of claim 8, wherein said processor includes a delay locked loop circuit configured to provide a delayed strobe signal during reading of data as part of said data write/read operations.

10. The system of claim 8, wherein the number of bit lines in said plurality of bit lines is $2^N$, where $N \geq 1$.

11. The system of claim 8, wherein said processor is configured to transmit said one or more of said first plurality of data patterns and said one or more of said second plurality of data patterns concurrently.

12. The system of claim 8, wherein said processor includes:
a first linear feedback shift register configured to generate said first plurality of data patterns; and
a second linear feedback shift register configured to generate said second plurality of data patterns.

13. The system of claim 8, wherein said processor further includes a decode circuit having a plurality of output lines, wherein each output line is configured to be connected to one of said plurality of bit lines so as to allow transmission of said first and said second plurality of bit patterns on respective bit lines.

14. The system of claim 8, wherein said processor is further configured to shift said first plurality of data patterns by at least one bit from said second plurality of data patterns.

15. The system of claim 8, wherein said processor is further configured to perform transmission of said first plurality of data patterns and said second plurality of data patterns for each bit line in said plurality of bit lines.

16. A system comprising:
a memory chip including a plurality of storage locations to store data;
a bus having a plurality of bit lines; and
a processor connected to said memory chip via said bus and in communication therewith through said bus, wherein said processor is configured to perform the following:
select a first group of bit lines from said bus to carry a first plurality of data patterns;
select at least one of the remaining bit lines from said bus not within said first group to carry a second data pattern;
transmit one or more of said first plurality of data patterns on said first group of bit lines;
transmit said second data pattern on said at least one of the remaining bit lines; and
perform data write/read operations at one of said plurality of storage locations using said bus and said one or more of said first plurality of data patterns and said second data pattern ; and
adjust a delay applied to a strobe signal based on an accuracy of data read compared to data written in said data write/read operations.

17. The system of claim 16, wherein said processor is further configured to store said first plurality of data patterns and said second data pattern.

18. The system of claim 16, wherein said processor is further configured to transmit each data pattern of said first plurality of data patterns concurrently with said second data pattern.

19. A method of operating a processor connected to a memory through a bus having a plurality of bit lines, said method comprising:
selecting a first group of bit lines from said bus to carry a first plurality of data patterns;
selecting at least one of the remaining bit lines from said bus not within said first group to carry a second plurality of data patterns;
transmitting one or more of said first plurality of data patterns on said first group of bit lines,
transmitting one or more of said second plurality of data patterns on said at least one of the remaining bit lines;
performing data write/read operations at a data storage location in said memory using said bus and said one or more of said first plurality of data patterns and said one or more of said second plurality of data patterns; and
adjusting a delay based on an accuracy of data read compared to data written in said data write/read operations.

20. The method of claim 19, wherein said performing includes:
performing reading of data as part of said data write/read operations in conjunction with a strobe signal received from a delay locked loop.

21. The method of claim 20, further comprising:
configuring said delay locked loop to provide said delay to said strobe signal such that said strobe signal is centered in the middle of data signals.

22. The method of claim 19, wherein each of said one or more of said first plurality of data patterns is concurrently transmitted with one of said one or more of said second plurality of data patterns.

* * * * *